(12) United States Patent
Ahn et al.

(10) Patent No.: US 12,108,604 B2
(45) Date of Patent: Oct. 1, 2024

(54) VERTICAL TRANSISTOR FABRICATION FOR MEMORY APPLICATIONS

(71) Applicant: Applied Materials, Inc., Santa Clara, CA (US)

(72) Inventors: Jaesoo Ahn, San Jose, CA (US); Thomas Kwon, Dublin, CA (US); Mahendra Pakala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 161 days.

(21) Appl. No.: 17/479,789

(22) Filed: Sep. 20, 2021

(65) Prior Publication Data
US 2022/0005831 A1 Jan. 6, 2022

Related U.S. Application Data

(62) Division of application No. 16/265,192, filed on Feb. 1, 2019, now Pat. No. 11,127,760.

(51) Int. Cl.
*H10B 51/20* (2023.01)
*H01L 21/02* (2006.01)
(Continued)

(52) U.S. Cl.
CPC ....... *H10B 51/20* (2023.02); *H01L 21/02164* (2013.01); *H01L 21/02236* (2013.01);
(Continued)

(58) Field of Classification Search
CPC ..................................................... H10B 41/27
See application file for complete search history.

(56) References Cited

U.S. PATENT DOCUMENTS 6,964,928 B2  11/2005  Mng et al.
7,750,421 B2   7/2010  Horng et al.
(Continued)

FOREIGN PATENT DOCUMENTS

CN    101483194 A    7/2009
CN    107305896 A   10/2017
(Continued)

OTHER PUBLICATIONS

Japanese Office Action for Application No. 2021-544121 dated Jun. 27, 2023.
(Continued)

*Primary Examiner* — Moazzam Hossain
*Assistant Examiner* — Hajar Kolahdouzan
(74) *Attorney, Agent, or Firm* — Patterson + Sheridan, LLP

(57) ABSTRACT

Embodiments of the present disclosure provide an apparatus and methods for forming stair-like structures with accurate profiles and dimension control for manufacturing three dimensional (3D) stacked memory cell semiconductor devices. In one embodiment, a memory cell device includes a film stack comprising alternating pairs of dielectric layers and conductive structures horizontally formed on a substrate, an opening formed in the film stack, wherein the opening is filled with a channel layer and a center filling layer, and a protective liner layer disposed between the conductive structure and the channel layer.

10 Claims, 9 Drawing Sheets

(51) Int. Cl.
*H01L 21/28* (2006.01)
*H01L 21/311* (2006.01)
*H01L 29/51* (2006.01)
*H01L 29/66* (2006.01)
*H01L 29/78* (2006.01)

(52) U.S. Cl.
CPC ...... *H01L 29/40111* (2019.08); *H01L 29/516* (2013.01); *H01L 29/517* (2013.01); *H01L 29/66666* (2013.01); *H01L 29/6684* (2013.01); *H01L 29/7827* (2013.01); *H01L 29/78391* (2014.09); *H01L 21/02252* (2013.01); *H01L 21/02532* (2013.01); *H01L 21/0262* (2013.01); *H01L 21/02636* (2013.01); *H01L 21/31116* (2013.01)

(56) References Cited

U.S. PATENT DOCUMENTS

| | | | |
|---|---|---|---|
| 9,028,910 | B2 | 5/2015 | Zhou et al. |
| 2004/0101978 | A1 | 5/2004 | Linn et al. |
| 2009/0121271 | A1 | 5/2009 | Son et al. |
| 2010/0155810 | A1 | 6/2010 | Kim et al. |
| 2012/0119283 | A1 | 5/2012 | Lee et al. |
| 2013/0175644 | A1 | 7/2013 | Horng et al. |
| 2014/0162429 | A1 | 6/2014 | Kim et al. |
| 2015/0255507 | A1 | 9/2015 | Pakala et al. |
| 2016/0351799 | A1 | 12/2016 | Xue et al. |
| 2017/0018563 | A1 | 1/2017 | Nishida |
| 2017/0278859 | A1 | 9/2017 | Sharangpani et al. |
| 2018/0114794 | A1* | 4/2018 | Jang ............ H10B 43/27 |
| 2018/0323208 | A1 | 11/2018 | Sugino et al. |
| 2020/0212068 | A1 | 7/2020 | Lee et al. |

FOREIGN PATENT DOCUMENTS

| | | |
|---|---|---|
| CN | 107431071 A | 12/2017 |
| JP | 2009117843 | 5/2009 |
| KR | 20180059271 A | 6/2018 |
| TW | 201836127 A | 10/2018 |

OTHER PUBLICATIONS

Korean Office Action for Application No. 10-2021-7026935 dated Jul. 15, 2023.
Japanese Office Action for Application No. 2021-544121 dated Nov. 15, 2022.
PCT Notification of Transmittal of the International Search Report and the Written Opinion of the International Searching Authority for International Application No. PCT/US2020/012110; dated Apr. 29, 2020; 12 total pages.
Taiwan Office Action for Application No. 109100265 dated Oct. 16, 2023.
Korean Office Action for Application No. 10-2021-7026935 dated Feb. 16, 2024.
Chinese Office Action for Application No. 202080012010.0, dated May 22, 2024.

* cited by examiner

VERTICAL TRANSISTOR FABRICATION FOR MEMORY APPLICATIONS

CROSS-REFERENCE TO RELATED APPLICATIONS

This application is a divisional of U.S. patent application Ser. No. 16/265,192 filed Feb. 1, 2019, the contents of which are incorporated herein by reference in its entirety.

BACKGROUND

Field

Embodiments of the present disclosure generally relate to methods of manufacturing a vertical type memory cell semiconductor device, and more particularly to methods of manufacturing a vertical type memory cell semiconductor device with stair-like structures for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor memory chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

When forming stair-like structures in a film stack disposed on a substrate, an etching process along with a photoresist trimming process are repeatedly performed to etch the film stack with sequentially trimmed photoresist layer as etching masks. In an exemplary embodiment depicted in FIG. 1A, a trimmed photoresist layer (not shown) may serve as an etching mask layer to transfer structures onto a film stack 120 disposed on a substrate 104 to form stair-like structures 110 on the substrate 104 for forming a semiconductor device 100. The film stack 120 typically includes alternating layers of layers 120$a$, 120$b$ (shown as 120$a_1$, 120$b_1$, 120$a_2$, 120$b_2$, ..., 120$a_5$, 120$b_5$), either conductive layers or insulating layers, as shown in FIG. 1B. During etching, the photoresist layer is sequentially trimmed to different dimensions while serving as an etch mask to form stair-like structures 110 having different widths.

During manufacturing of the stair-like structures 110 on the substrate 104, each stair formed in the stair-like structures 110 has its intended width to allow channels 125 (e.g., openings) to be formed thereon, as shown in FIGS. 1A and 1B. In some embodiment where a higher device performance is required, different materials of the alternating layers 120$a$, 120$b$ may be utilized. For example, when a higher electric mobility of the device performance is required, a metal conductive material is often utilized in the stair-like structures 110. In one example, a second layer 120$b$ (shown as 120$b_1$, ..., 120$b_5$ in FIG. 1B) of the alternating layers 120$a$, 120$b$ may be removed from the stair-like structures 110 and replaced with a metal containing layer 150, as depicted in FIG. 1C, to improve the electrical performance of the device 100. However, when removing the original second layer 120$b$ (shown as 120$b_1$, ..., 120$b_5$ in FIG. 1B) from the stair-like structures 110 to replace or insert with the metal containing layer 150 as depicted in FIG. 1C, residuals and/or surface roughness 152 are often found at the interface 130 between the metal containing layer 150 due to etching selective at the interface, thus creating poor electrical contact at the interface 130, eventually leading to device failure or electrical performance degradation.

Thus, there is a need for improved methods and apparatus for forming stair-like structures with accurate profiles and dimension control for three dimensional (3D) stacking of semiconductor devices.

SUMMARY

Embodiments of the present disclosure provide an apparatus and methods for forming stair-like structures with accurate profiles and dimension control for manufacturing three dimensional (3D) stacked memory cell semiconductor devices. In one embodiment, a memory cell device includes a film stack comprising alternating pairs of dielectric layers and conductive structures horizontally formed on a substrate, an opening formed in the film stack, wherein the opening is filled with a channel layer and a center filling layer, and a protective liner layer disposed between the conductive structure and the channel layer.

In another embodiment, a method of memory device on a substrate includes forming an opening in a film stack including a first layer and a second layer, filling the opening with one or more layers, wherein the one or more layers comprise a channel layer, selectively removing the first layer from the film stack to expose a portion of the channel layer, selectively oxidizing the portion of the channel layer to form a protective liner layer, and filling the space with a conductive structure.

In yet another embodiment, a method of forming stair-like structures on a substrate includes selectively oxidizing a portion of a channel layer exposed by a space defined between dielectric layers formed in a film stack, wherein the film stack has a center opening filled by a multi-layer structure comprising the channel layer, forming a protective liner layer on the portion of the channel layer, and forming a ferroelectric layer in contact with the protective liner layer, wherein the barrier layer is a high dielectric constant material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for forming stair-like structures on a substrate for three dimensional (3D) memory cells of semiconductor devices. In one example, good interface management, superior electrical performance and good process control during manufacturing may be obtained by utilizing a protective interface layer (e.g., an interface oxidation layer) at the interface along with a selective deposition and selective patterning/etching process. In one example, a method of forming memory cells for three dimensional (3D) stacked semiconductor devices may utilizes a protective oxidation layer when removing a certain type of the material from the film stack for forming the stair-like structures. Furthermore, a high dielectric constant material is utilized to form with a conductive material to replace a portion of the stair-like structures with conductive structures. The interface/protective oxidation layer remains protected and intact during the removal process, thus providing a good control of the interface profile and topography. Thus, a good electrical contact at the interface may be obtained after the conductive structure including the high dielectric constant material as well as the conductive material is formed in the stair-like structures, thus providing a desired electrical performance to the memory cells.

Figure 1A:
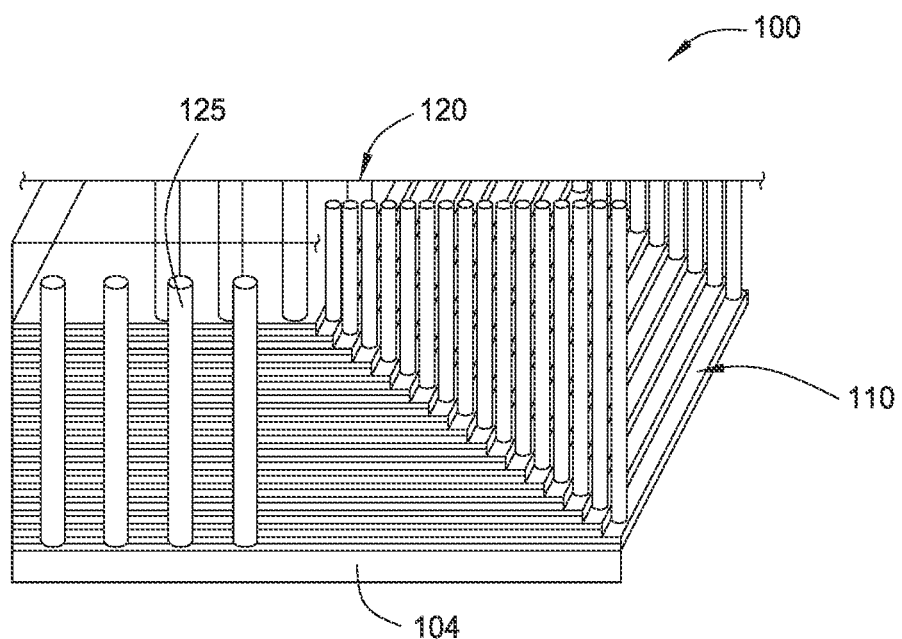
FIG. 1A depicts a schematic cross-sectional view of conventional stair-like structures formed on a substrate.
Figure 1B:
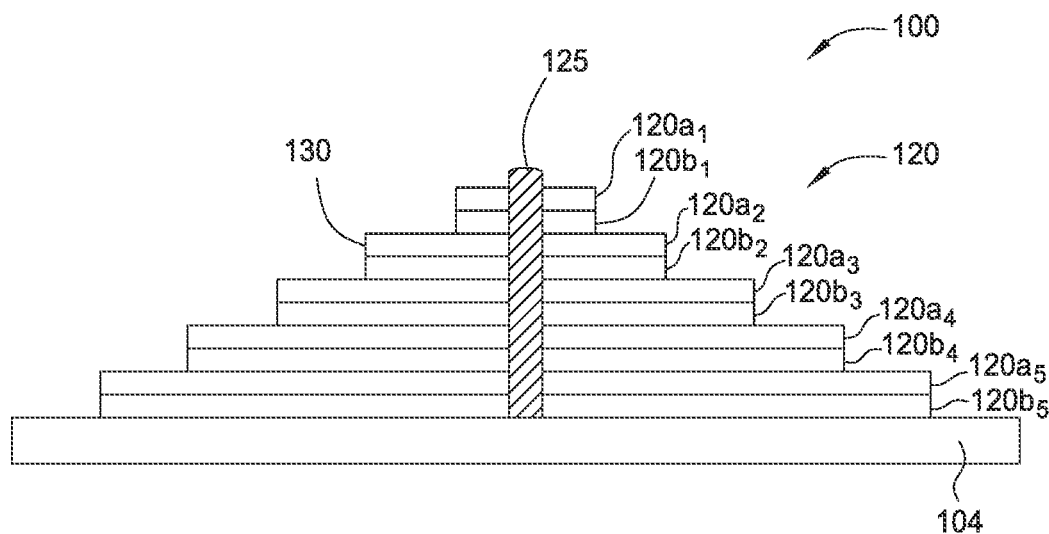
FIGS. 1B and 1C depict partial schematic cross-sectional views of the conventional stair-like structures formed on the substrate of FIG. 1A.
Figure 1C:
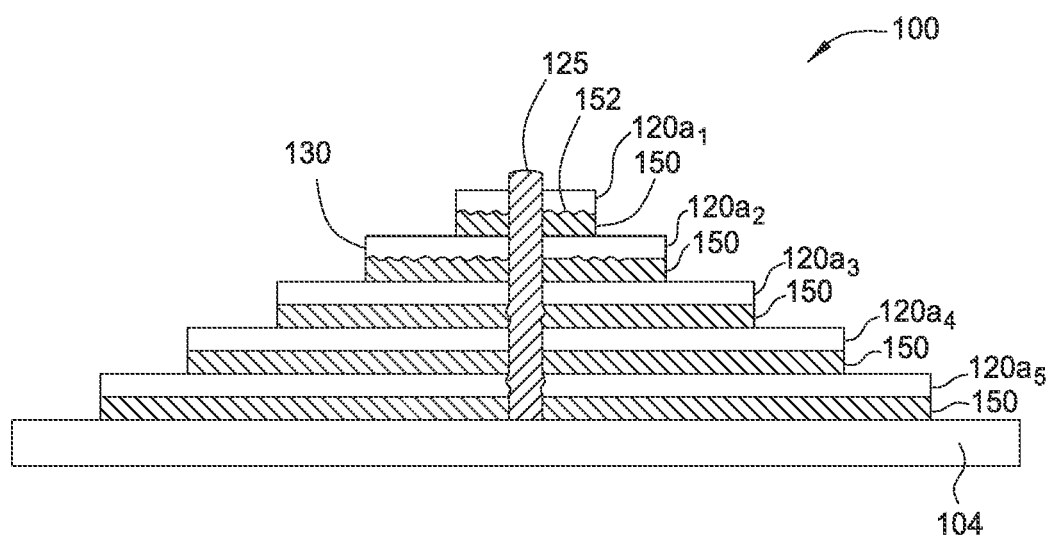
Figure 2:
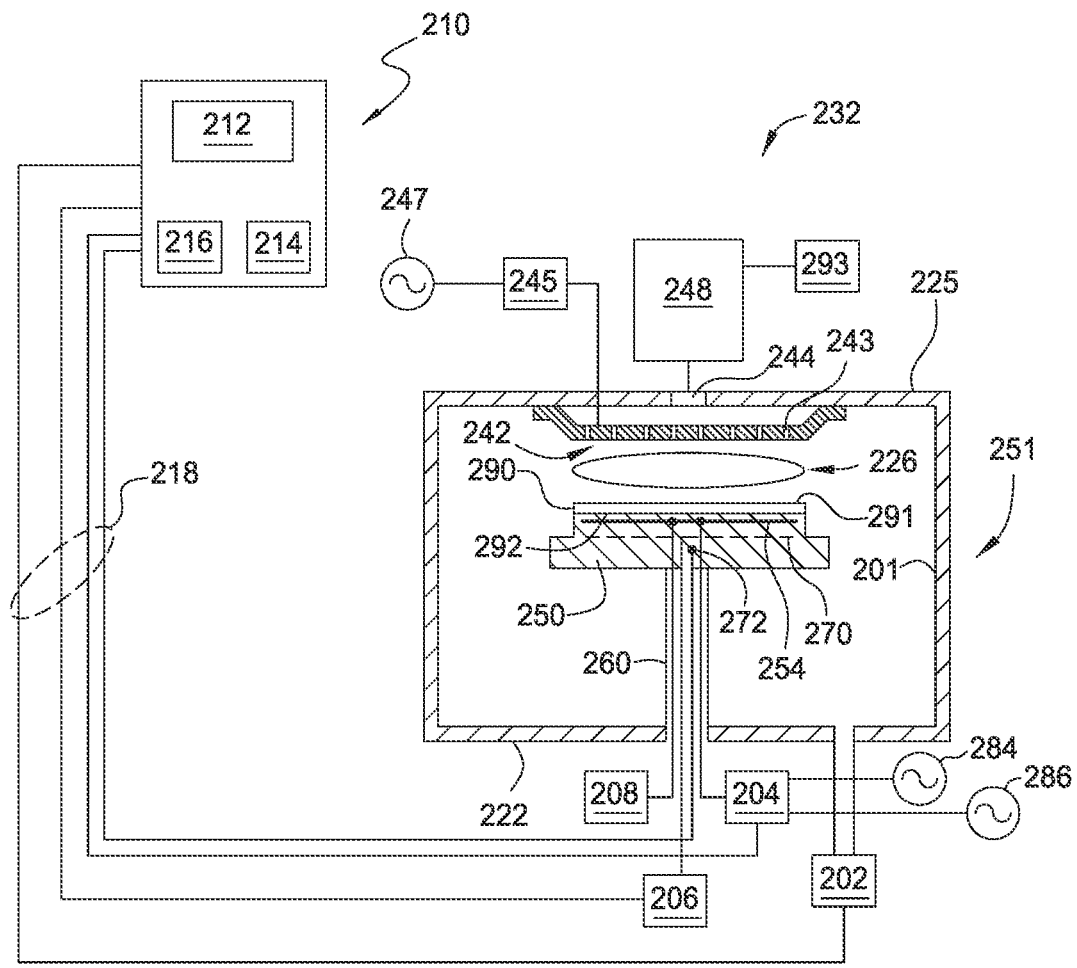
FIG. 2 depicts an apparatus utilized to form a metal containing layer in stair-like structures on a substrate in accordance with one embodiment of the present disclosure.

FIG. 2 is a cross sectional view of a plasma processing chamber 232 suitable for performing a plasma deposition process (e.g., a plasma enhanced CVD or a metal organic CVD) that may be utilized as semiconductor interconnection structures for semiconductor devices manufacture. The processing chamber 232 may be a suitably adapted CENTURA®, PRODUCER® SE or PRODUCER® GT or PRODUCER® XP processing system available from Applied Materials, Inc., of Santa Clara, California. It is contemplated that other processing systems, including those produced by other manufacturers, may benefit from embodiments described herein.

The processing chamber 232 includes a chamber body 251. The chamber body 251 includes a lid 225, a sidewall 201 and a bottom wall 222 that define an interior volume 226.

A substrate support pedestal 250 is provided in the interior volume 126 of the chamber body 251. The pedestal 250 may be fabricated from aluminum, ceramic, aluminum nitride, and other suitable materials. In one embodiment, the pedestal 250 is fabricated by a ceramic material, such as aluminum nitride, which is a material suitable for use in a high temperature environment, such as a plasma process environment, without causing thermal damage to the pedestal 250. The pedestal 250 may be moved in a vertical direction inside the chamber body 251 using a lift mechanism (not shown).

The pedestal 250 may include an embedded heater element 270 suitable for controlling the temperature of a substrate 290 supported on the pedestal 250. In one embodiment, the pedestal 250 may be resistively heated by applying an electric current from a power supply 206 to the heater element 270. In one embodiment, the heater element 270 may be made of a nickel-chromium wire encapsulated in a nickel-iron-chromium alloy (e.g., INCOLOY®) sheath tube. The electric current supplied from the power supply 206 is regulated by the controller 210 to control the heat generated by the heater element 270, thus maintaining the substrate 290 and the pedestal 250 at a substantially constant temperature during film deposition at any suitable temperature range. In another embodiment, the pedestal may be maintained at room temperature as needed. In yet another embodiment, the pedestal 250 may also include a chiller (not shown) as needed to cool the pedestal 250 at a range lower than room temperature as needed. The supplied electric current may be adjusted to selectively control the temperature of the pedestal 250 between about 100 degrees Celsius to about 700 degrees Celsius.

A temperature sensor 272, such as a thermocouple, may be embedded in the substrate support pedestal 250 to monitor the temperature of the pedestal 250 in a conventional manner. The measured temperature is used by the controller 210 to control the power supplied to the heater element 270 to maintain the substrate at a desired temperature.

The pedestal 250 generally includes a plurality of lift pins (not shown) disposed therethrough that are configured to lift the substrate 290 from the pedestal 250 and facilitate exchange of the substrate 290 with a robot (not shown) in a conventional manner.

The pedestal 250 comprises at least one electrode 292 for retaining the substrate 290 on the pedestal 250. The electrode 292 is driven by a chucking power source 208 to develop an electrostatic force that holds the substrate 290 to the pedestal surface, as is conventionally known. Alternatively, the substrate 290 may be retained to the pedestal 250 by clamping, vacuum or gravity.

In one embodiment, the pedestal 250 is configured as a cathode having the electrode 292 embedded therein coupled to at least one RF bias power source, shown in FIG. 2 as two RF bias power sources 284, 286. Although the example depicted in FIG. 2 shows two RF bias power sources, 284, 286, it is noted that the number of the RF bias power sources may be any number as needed. The RF bias power sources 284, 286 are coupled between the electrode 292 disposed in the pedestal 250 and another electrode, such as a gas distribution plate 242 or lid 225 of the processing chamber 232. The RF bias power source 284, 286 excites and sustains a plasma discharge formed from the gases disposed in the processing region of the processing chamber 232.

In the embodiment depicted in FIG. 2, the dual RF bias power sources 284, 286 are coupled to the electrode 292 disposed in the pedestal 250 through a matching circuit 204. The signal generated by the RF bias power source 284, 286 is delivered through matching circuit 204 to the pedestal 250 through a single feed to ionize the gas mixture provided in the plasma processing chamber 232, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts.

A vacuum pump 202 is coupled to a port formed in the bottom 222 of the chamber body 251. The vacuum pump 202 is used to maintain a desired gas pressure in the chamber body 251. The vacuum pump 202 also evacuates post-processing gases and by-products of the process from the chamber body 251.

The processing chamber 232 includes one or more gas delivery passages 244 coupled through the lid 225 of the processing chamber 232. The gas delivery passages 244 and the vacuum pump 202 are positioned at opposite ends of the processing chamber 232 to induce laminar flow within the interior volume 226 to minimize particulate contamination.

The gas delivery passage 244 is coupled to the gas panel 293 through a remote plasma source (RPS) 248 to provide a gas mixture into the interior volume 226. In one embodiment, the gas mixture supplied through the gas delivery passage 244 may be further delivered through a gas distribution plate 242 disposed below the gas delivery passage 244. In one example, the gas distribution plate 242 having a plurality of apertures 243 is coupled to the lid 225 of the chamber body 251 above the pedestal 250. The apertures 243 of the gas distribution plate 242 are utilized to introduce process gases from the gas panel 293 into the chamber body 251. The apertures 243 may have different sizes, number, distributions, shape, design, and diameters to facilitate the flow of the various process gases for different process requirements. A plasma is formed from the process gas mixture exiting the gas distribution plate 242 to enhance thermal decomposition of the process gases resulting in the deposition of material on the surface 291 of the substrate 290.

The gas distribution plate 242 and substrate support pedestal 250 may be formed a pair of spaced apart electrodes in the interior volume 226. One or more RF sources 247 provide a bias potential through a matching network 245 to the gas distribution plate 242 to facilitate generation of a plasma between the gas distribution plate 242 and the pedestal 250. Alternatively, the RF sources 247 and matching network 245 may be coupled to the gas distribution plate 242, substrate support pedestal 250, or coupled to both the gas distribution plate 242 and the substrate support pedestal 250, or coupled to an antenna (not shown) disposed exterior to the chamber body 251. In one embodiment, the RF sources 247 may provide between about 10 Watts and about 3000 Watts at a frequency of about 30 kHz to about 13.6 MHz. Alternatively, the RF source 247 may be a microwave generator that provide microwave power to the gas distribution plate 242 that assists generation of the plasma in the interior volume 226.

Examples of gases that may be supplied from the gas panel 293 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one embodiment, the remote plasma source (RPS) 248 may be alternatively coupled to the gas delivery passages 244 to assist in forming a plasma from the gases supplied from the gas panel 293 into the in the interior volume 226. The remote plasma source 248 provides plasma formed from the gas mixture provided by the gas panel 293 to the processing chamber 232.

The controller 210 includes a central processing unit (CPU) 212, a memory 216, and a support circuit 214 utilized to control the process sequence and regulate the gas flows from the gas panel 293. The CPU 212 may be of any form of a general purpose computer processor that may be used in an industrial setting. The software routines can be stored in the memory 216, such as random access memory, read only memory, floppy, or hard disk drive, or other form of digital storage. The support circuit 214 is conventionally coupled to the CPU 212 and may include cache, clock circuits, input/output systems, power supplies, and the like. Bi-directional communications between the controller 210 and the various components of the processing chamber 232 are handled through numerous signal cables collectively referred to as signal buses 218, some of which are illustrated in FIG. 2.

Figure 3:
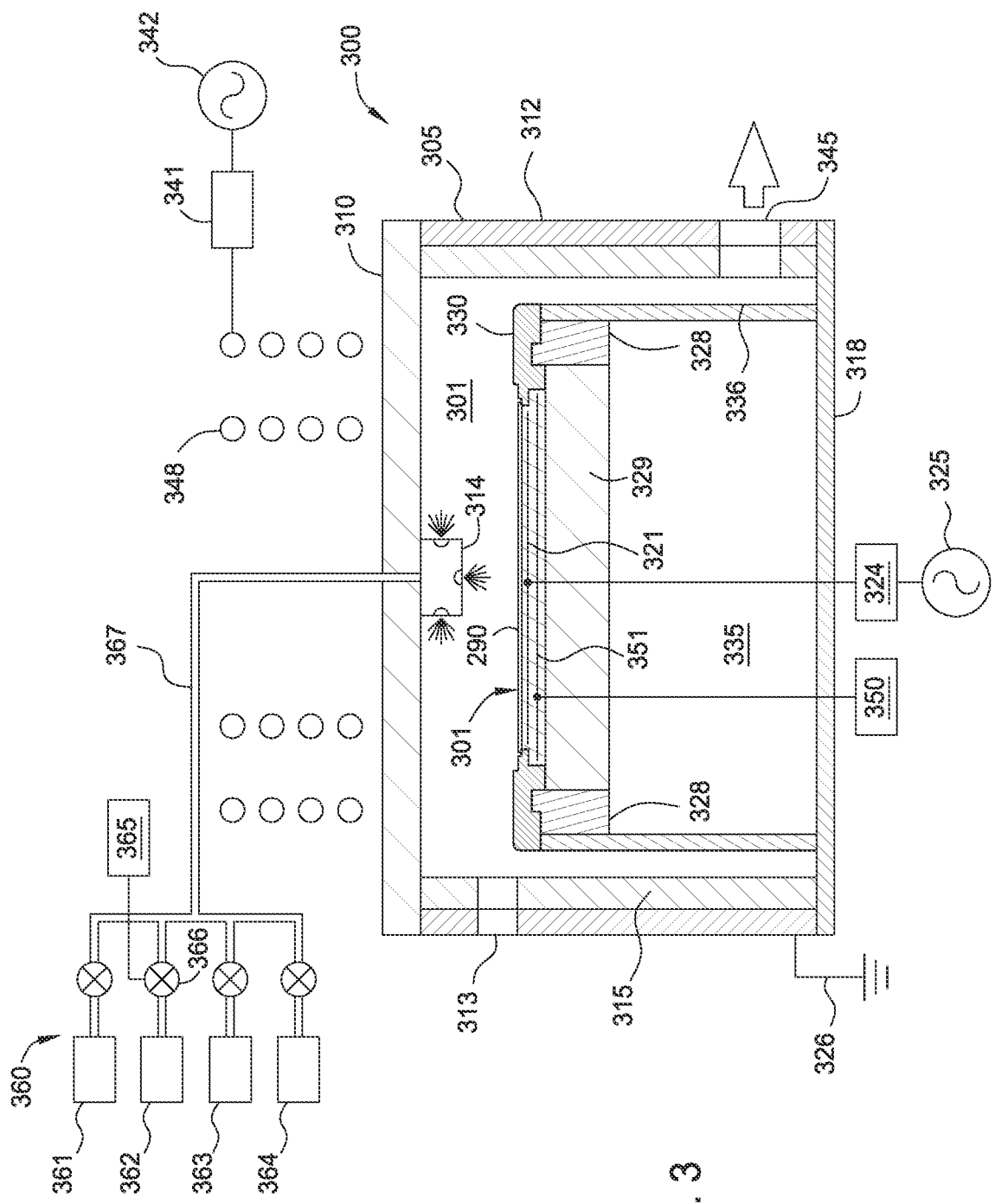
FIG. 3 depicts an apparatus utilized to form stair-like structures on a substrate in accordance with one embodiment of the present disclosure.

FIG. 3 is a simplified cutaway view for an exemplary processing chamber 300 for etching a metal layer. The exemplary processing chamber 300 is suitable for removing one or more film layers from the substrate 290. One example of the process chamber that may be adapted to benefit from the invention is an AdvantEdge Mesa Etch processing chamber, available from Applied Materials, Inc., located in Santa Clara, California. It is contemplated that other process chambers, including those from other manufactures, may be adapted to practice embodiments of the invention.

The processing chamber 300 includes a chamber body 305 having a chamber volume 301 defined therein. The chamber body 305 has sidewalls 312 and a bottom 318 which are coupled to ground 326. The sidewalls 312 have a liner 315 to protect the sidewalls 312 and extend the time between maintenance cycles of the processing chamber 300. The dimensions of the chamber body 305 and related components of the processing chamber 300 are not limited and generally are proportionally larger than the size of the substrate 290 to be processed therein. Examples of substrate sizes include 200 mm diameter, 250 mm diameter, 300 mm diameter and 450 mm diameter, among others.

The chamber body 305 supports a chamber lid assembly 310 to enclose the chamber volume 301. The chamber body 305 may be fabricated from aluminum or other suitable materials. A substrate access port 313 is formed through the sidewall 312 of the chamber body 105, facilitating the transfer of the substrate 290 into and out of the processing chamber 300. The access port 313 may be coupled to a transfer chamber and/or other chambers of a substrate processing system (not shown).

A pumping port 345 is formed through the sidewall 312 of the chamber body 305 and connected to the chamber volume 301. A pumping device (not shown) is coupled through the pumping port 345 to the chamber volume 301 to evacuate and control the pressure therein. The pumping device may include one or more pumps and throttle valves.

A gas panel 360 is coupled by a gas line 367 to the chamber body 305 to supply process gases into the chamber volume 301. The gas panel 360 may include one or more process gas sources 361, 362, 363, 364 and may additionally include inert gases, non-reactive gases, and reactive gases, if desired. Examples of process gases that may be provided by the gas panel 360 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), and oxygen gas ($O_2$). Additionally, process gasses may include chlorine, fluorine, oxygen and hydrogen containing gases such as $BCl_3$, $C_4F_8$, $C_4F_6$, $CHF_3$, $CH_2F_2$, $CH_3F$, $NF_3$, $CO_2$, $SO_2$, CO, and $H_2$ among others.

Valves 366 control the flow of the process gases from the sources 361, 362, 363, 364 from the gas panel 360 and are managed by a controller 365. The flow of the gases supplied to the chamber body 305 from the gas panel 360 may include combinations of the gases.

The lid assembly 310 may include a nozzle 314. The nozzle 314 has one or more ports for introducing the process gases from the sources 361, 362, 364, 363 of the gas panel 360 into the chamber volume 301. After the process gases are introduced into the processing chamber 300, the gases are energized to form plasma. An antenna 348, such as one or more inductor coils, may be provided adjacent to the processing chamber 300. An antenna power supply 342 may power the antenna 348 through a match circuit 341 to inductively couple energy, such as RF energy, to the process gas to maintain a plasma formed from the process gas in the chamber volume 301 of the processing chamber 300. Alternatively, or in addition to the antenna power supply 342, process electrodes below the substrate 290 and/or above the substrate 290 may be used to capacitively couple RF power to the process gases to maintain the plasma within the chamber volume 301. The operation of the antenna power supply 342 may be controlled by a controller, such as controller 365, that also controls the operation of other components in the processing chamber 300.

A substrate support pedestal 335 is disposed in the chamber volume 301 to support the substrate 290 during processing. The substrate support pedestal 335 may include an electro-static chuck 322 for holding the substrate 290 during processing. The electro-static chuck (ESC) 322 uses the electro-static attraction to hold the substrate 290 to the substrate support pedestal 335. The ESC 322 is powered by an RF power supply 325 integrated with a match circuit 324. The ESC 322 comprises an electrode 321 embedded within a dielectric body. The RF power supply 325 may provide a RF chucking voltage of about 200 volts to about 2000 volts to the electrode 321. The RF power supply 325 may also include a system controller for controlling the operation of the electrode 321 by directing a DC current to the electrode 321 for chucking and de-chucking the substrate 290.

The ESC 322 may also include an electrode 351 deposed therein. The electrode 351 is coupled to a power source 350 and provides a bias which attracts plasma ions, formed by the process gases in the chamber volume 301, to the ESC 322 and substrate 290 positioned thereon. The power source 350 may cycle on and off, or pulse, during processing of the substrate 290. The ESC 322 has an isolator 328 for the purpose of making the sidewall of the ESC 322 less attractive to the plasma to prolong the maintenance life cycle of the ESC 322. Additionally, the substrate support pedestal 335 may have a cathode liner 336 to protect the sidewalls of the substrate support pedestal 335 from the plasma gases and to extend the time between maintenance of the processing chamber 300.

The ESC 322 may include heaters disposed therein and connected to a power source (not shown), for heating the substrate, while a cooling base 329 supporting the ESC 322 may include conduits for circulating a heat transfer fluid to maintain a temperature of the ESC 322 and the substrate 290 disposed thereon. The ESC 322 is configured to perform in the temperature range required by the thermal budget of the device being fabricated on the substrate 290. For example, the ESC 322 may be configured to maintain the substrate 290 at a temperature of about minus about 25 degrees Celsius to about 500 degrees Celsius for certain embodiments.

The cooling base 329 is provided to assist in controlling the temperature of the substrate 290. To mitigate process drift and time, the temperature of the substrate 290 may be maintained substantially constant by the cooling base 329 throughout the time the substrate 290 is in the processing chamber 300. In one embodiment, the temperature of the substrate 290 is maintained throughout subsequent etch processes at about 70 to 90 degrees Celsius.

A cover ring 330 is disposed on the ESC 322 and along the periphery of the substrate support pedestal 335. The cover ring 330 is configured to confine etching gases to a desired portion of the exposed top surface of the substrate 290, while shielding the top surface of the substrate support pedestal 335 from the plasma environment inside the processing chamber 300. Lift pins (not shown) are selectively moved through the substrate support pedestal 335 to lift the substrate 290 above the substrate support pedestal 335 to facilitate access to the substrate 290 by a transfer robot (not shown) or other suitable transfer mechanism.

The controller 365 may be utilized to control the process sequence, regulating the gas flows from the gas panel 360 into the processing chamber 300 and other process parameters. Software routines, when executed by the CPU, transform the CPU into a specific purpose computer (controller) that controls the processing chamber 300 such that the processes are performed in accordance with the present invention. The software routines may also be stored and/or executed by a second controller (not shown) that is collocated with the processing chamber 300.

The substrate 290 has various film layers disposed thereon which may include at least one metal layer. The various film layers may require etch recipes which are unique for the different compositions of the other film layers in the substrate 290. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, processing chamber 300 is configured to at least etch a metal layer to form a conductive structure. For processing parameters provided herein, the processing chamber 300 is configured to process a 300 diameter substrate, i.e., a substrate having a plan area of about 0.0707 m². The process parameters, such as flow and power, may generally be scaled proportionally with the change in the chamber volume or substrate plan area.

Figure 4:
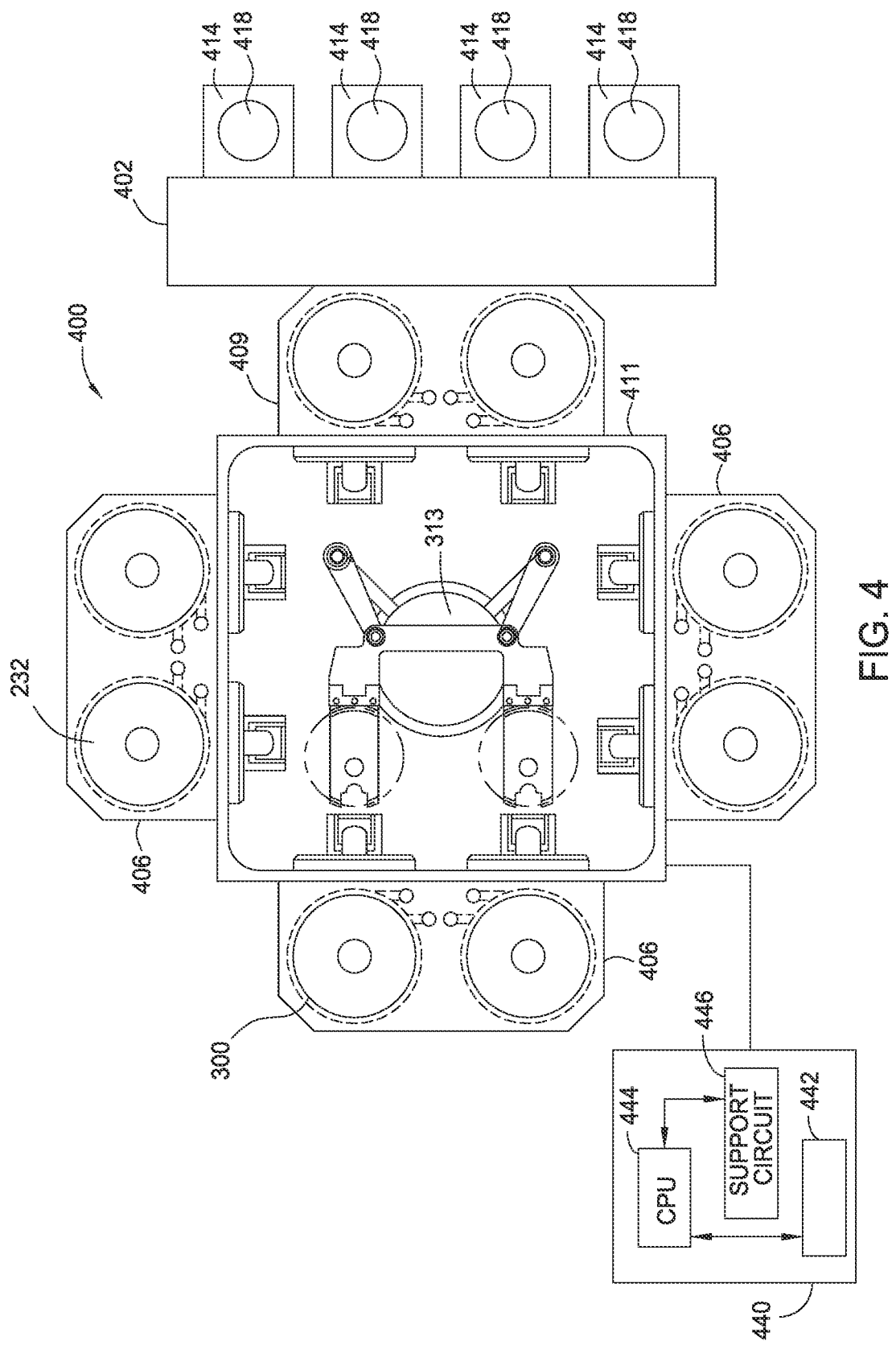
FIG. 4 depicts a schematic view of a cluster processing system that includes the apparatus of FIGS. 2 and 3.

FIG. 4 depicts a plan view of a semiconductor processing system 400 that the methods described herein may be practiced. One processing system that may be adapted to benefit from the invention is a 300 mm or 450 mm PRO-DUCER® processing system, commercially available from Applied Materials, Inc., of Santa Clara, California. The processing system 400 generally includes a front platform 402 where substrate cassettes 418 included in FOUPs 414 are supported and substrates are loaded into and unloaded from a loadlock chamber 409, a transfer chamber 411 housing a substrate handler 413 and a series of tandem processing chambers 406 mounted on the transfer chamber 411.

Each of the tandem processing chambers 406 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 406 can include a lid according to aspects of the invention as described below that includes one or more chamber configurations described above with referenced to the processing chambers 232, 300 depicted in FIG. 2 and/or FIG. 3. It is noted that the processing system 400 may be configured to perform a deposition process, etching process, curing processes, or heating/annealing process as needed. In one embodiment, the processing chambers 232, 300, shown as a single chamber designed in FIGS. 2 and 3, may be incorporated into the semiconductor processing system 400.

In one implementation, the processing system 400 can be adapted with one or more of the tandem processing chambers having supporting chamber hardware known to accommodate various other known processes such as chemical vapor deposition (CVD), physical vapor deposition (PVD), etching, curing, or heating/annealing and the like. For example, the system 400 can be configured with one of the processing chambers 232 in FIG. 2 as a plasma deposition chamber for deposition, such as a metal film, or one of the processing chambers 300 depicted in FIG. 3 as a plasma etching chamber for etching material layers formed on the substrates. Such a configuration can maximize research and development fabrication utilization and, if desired, eliminate exposure of films as etched to atmosphere.

A controller 440, including a central processing unit (CPU) 444, a memory 442, and support circuits 446, is coupled to the various components of the semiconductor processing system 400 to facilitate control of the processes of the present invention. The memory 442 can be any computer-readable medium, such as random access memory (RAM), read only memory (ROM), floppy disk, hard disk, or any other form of digital storage, local or remote to the semiconductor processing system 400 or CPU 444. The support circuits 446 are coupled to the CPU 444 for supporting the CPU in a conventional manner. These circuits include cache, power supplies, clock circuits, input/output circuitry and subsystems, and the like. A software routine or a series of program instructions stored in the memory 442, when executed by the CPU 444, executes the tandem processing chambers 406.

Figure 5:
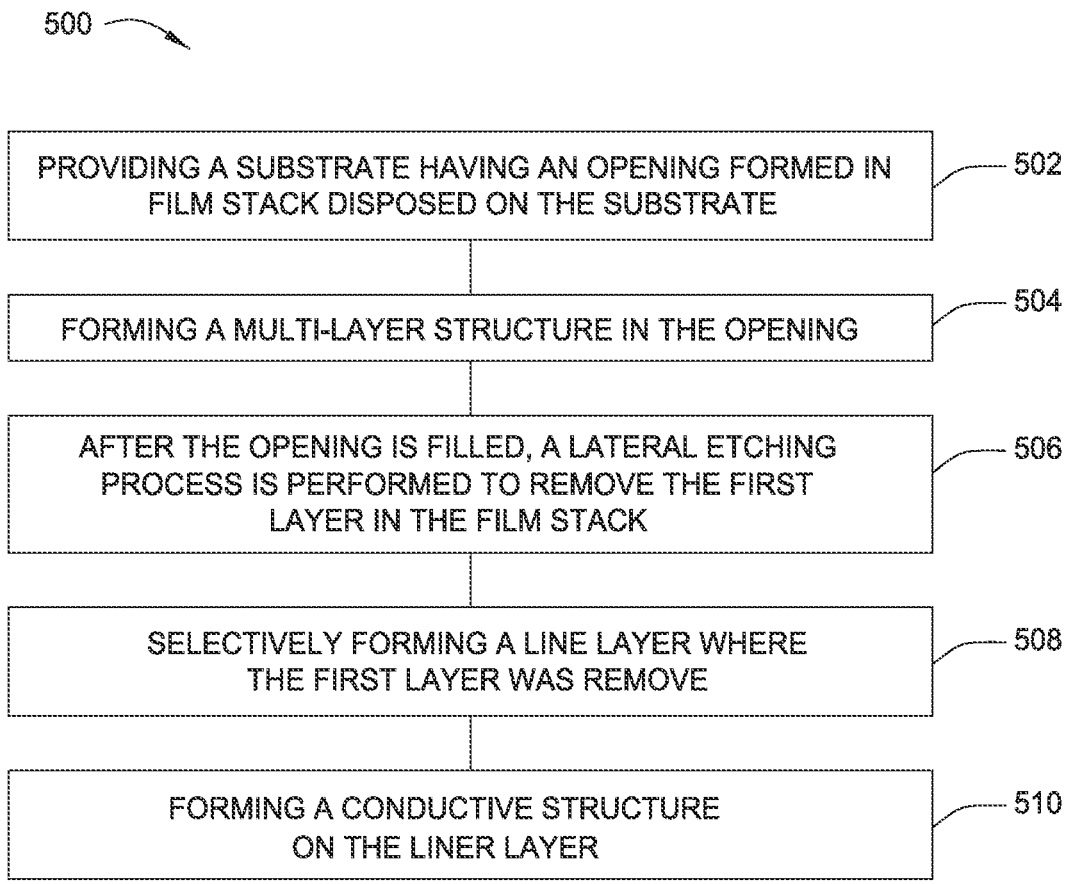
FIG. 5 depicts a flow diagram of a method for memory cell structures formed on a substrate in accordance with one embodiment of the present disclosure.

FIG. 5 is a flow diagram of one embodiment of a method 500 for forming memory cell structures in a film stack disposed on a substrate that may be performed in a processing chamber, such as the processing chamber 232 depicted in FIG. 2 and the processing chamber 300 depicted in FIG. 3 incorporated in the system 400 or other suitable processing chambers and system as needed. FIGS. 6A-6B and 7-10 are schematic cross-sectional views illustrating a sequence for forming memory cell structures in a film stack disposed on a substrate according to the method 500. Although the method 500 is described below with reference to a substrate utilized to manufacture memory cell structures in a film stack for three dimensional semiconductor devices, the method 500 may also be used to advantage in other device manufacturing applications.

Figure 6A:
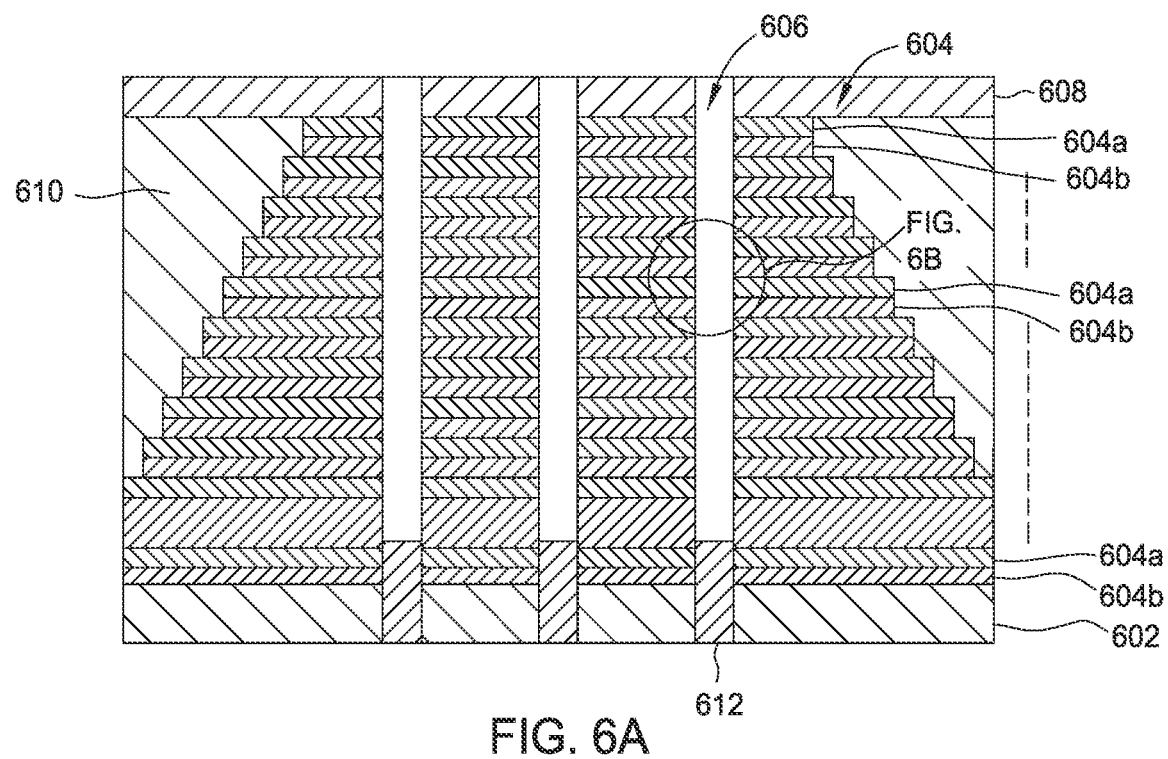
FIGS. 6A-6B, 7, 8, 9 and 10 depict a sequence for manufacturing memory cell structures formed on a substrate in accordance with the embodiment depicted in FIG. 5.

The method 500 begins at operation 502 by providing a substrate, such as a substrate 602 having a film stack 604 formed thereon, as shown in FIG. 6A. The substrate 602 may be a silicon based material or any suitable insulating materials or conductive materials as needed, having a film stack 604 disposed on the substrate 602 that may be utilized to form memory cell structures in the film stack 604.

As shown in the exemplary embodiment depicted in FIG. 6A, the substrate 602 may have a substantially planar surface, an uneven surface, or a substantially planar surface having a structure formed thereon. The film stack 604 is formed on the substrate 602. In one embodiment, the film stack 604 may be utilized to form a gate structure, a contact structure or an interconnection structure in the front end or back end processes. The method 500 may be formed on the film stack 604 to form the stair-like structures therein used in a memory cell structures, such as VNAND structures. In one embodiment, the substrate 602 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 602 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 602, the substrate 602 may include a buried dielectric layer disposed on a silicon crystalline substrate. In the embodiment depicted herein, the substrate 602 may be a crystalline silicon substrate.

In one embodiment, the film stack 604 disposed on the substrate 600 may have the film stack 604 that has a number of vertically stacked layers. The film stack 604 may comprise pairs including a first layer 604a and a second layer 604b repeatedly formed in the film stack 604. The pairs include alternating first layer 604a and second layer 604b repeatedly formed until desired numbers of pairs of the first layers and the second layers are reached.

The film stack 604 is a part of a memory cell device, such as a three-dimensional (3D) memory device. Although eleven repeating layers of first layers 604a and second layers 604b are shown in FIG. 6A, it is noted that any desired number of repeating pairs of the first and second layers may be utilized as needed.

In one embodiment, the film stack 604 may be utilized to form multiple gate structures for a three-dimensional (3D) memory device. The first layers 604a formed in the film stack 604 may be a first dielectric layer and the second layers 604b may be a second dielectric layer. Suitable dielectric layers may be utilized to form the first layers 604a and the second layer 604b, include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others.

In one particular example, the first layers 604a are silicon nitride layers while the second layers 604b are silicon oxide layers or polysilicon layers. In one embodiment, the thickness of first layers 604a may be controlled at between about 50 Å and about 1000 Å, such as about 500 Å, and the thickness of the each second layers 604b may be controlled at between about 50 Å and about 1000 Å, such as about 500 Å. The total thickness of the film stack 604 is about 3 microns to 10 microns and will vary as the technology advances.

The film stack 604 of the first layers 604a of silicon nitride layers and the second layers 604b of silicon oxide layers are formed on the substrate 602. The film stack 604 are formed and patterned into the stair-like structures surrounding by an insulating structure 610. A hardmask layer 608 may be formed on the film stack 604 to facilitate forming openings 606 (e.g., or called trenches, vias, apertures, or holes) in the film stack 604. The openings 606 may be utilized to form as channels in the device structure when the manufacturing process is completed. After the openings 606 are formed in the film stack 604, an epitaxial deposition process is performed to grow silicon containing posts 612, such as silicon material or SiGe material, in the bottom portions of the openings 606. It is noted that the device structures and configurations may be varied as needed for different device performance requirements.

Figure 6B:
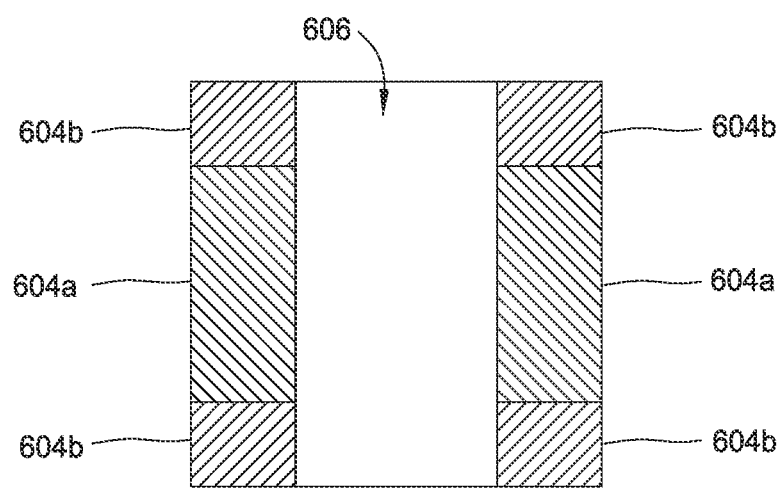

FIG. 6B depicts a magnified view of a portion of the film stack 604, as indicated by the circle, depicting the opening 606 surrounded by the first layer 604a and the second layer 604b. For ease of explanation, the magnified view of the film stack 604 will be utilized in the following descriptions, instead of the overall cross sectional view of the film stack 604 depicted in FIG. 6A.

Figure 7:
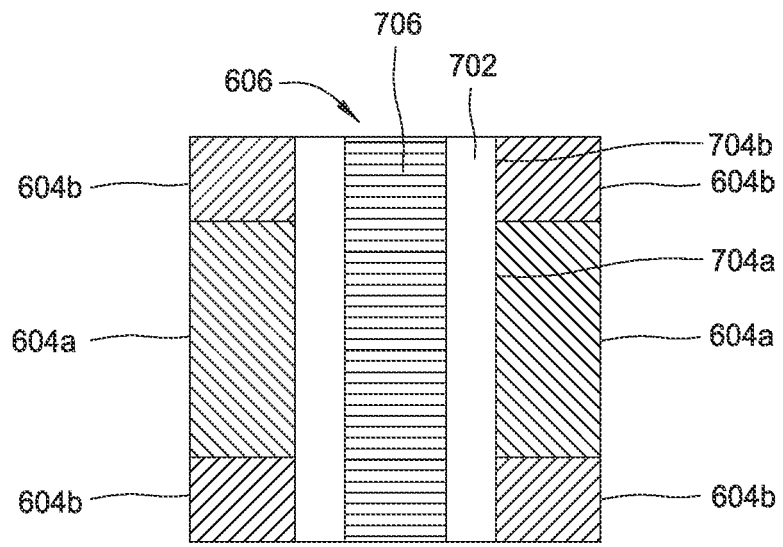

At operation 504, a multi-layer structure including a channel layer 702 and a center filling layer 706 is formed in the opening 606, as shown in FIG. 7. The channel layer 702 and the center filling layer 706 in combination forming a channel region to form the memory cells. In one embodiment, the channel layer 702 may be formed by a silicon containing material, such as doped silicon, polysilicon, silicon oxide, SiN, SiON, SiGe, or other suitable silicon containing materials. The center filling layer 706 is formed in the opening 606, filing the remaining space left from the channel layer 702, as shown in FIG. 7. The center filling layer 906 may also be a dielectric layer, such as $SiO_2$, SiN, SiON, or other suitable dielectric materials. It is noted that the channel layer 702 and the center filling layer 706 may be formed by suitable deposition process, such as CVD process, ALD process, sputtering process, coating process, or other suitable processes. In one example, the channel layer 702 and the center filling layer 706 may be formed in the processing chamber 232 depicted in FIG. 2.

Figure 8:
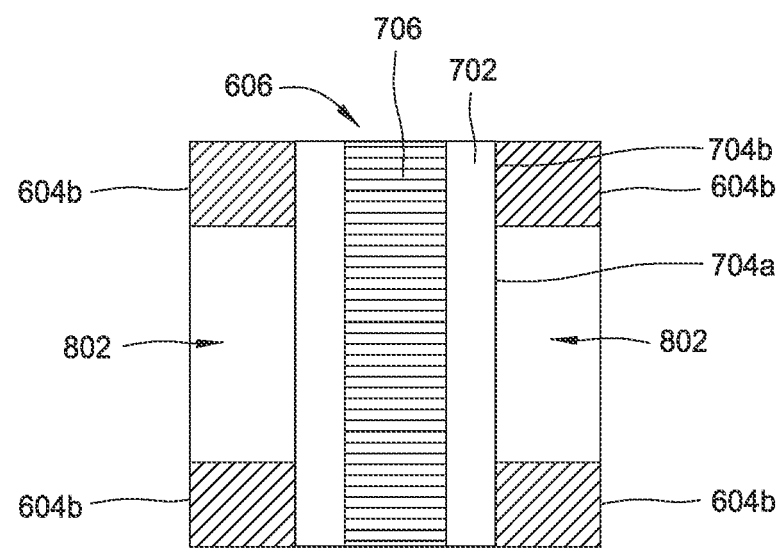

At operation 506, after the opening 606 is filled, a lateral selective etching process is performed to selectively remove the first layer 604a from the film stack 604, as shown in FIG. 8. Removal of the first layer 604a from the film stack 604 creates a space 802 in the film stack 604 where the first layer 604a was located, thus forming a suspended film stack with only the second layer 604b of the silicon oxide layer remained on the substrate 602. The space 802 exposes a sidewall 704a of the channel layer 702. The lateral selective etching process may be performed in the processing chamber 300 of FIG. 3.

Figure 9:
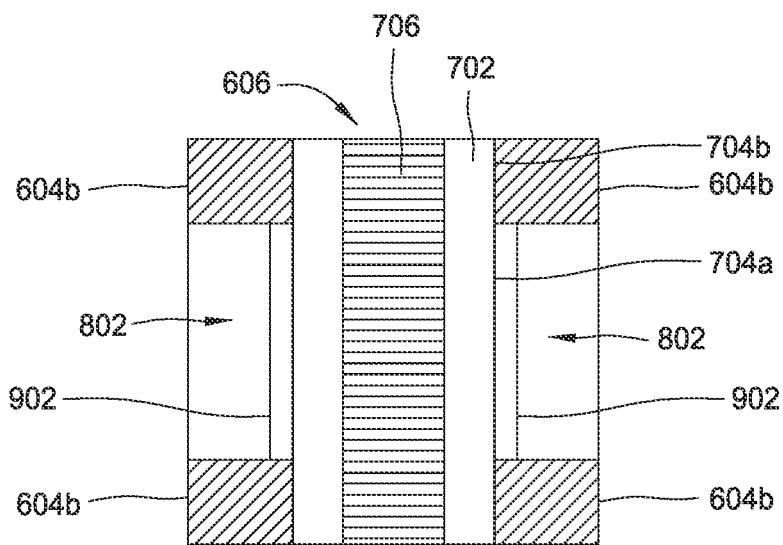

At operation 508, after the space 802 is defined, a selective oxidation process is performed to selectively oxidizing the channel layer 702 through the exposed sidewall 704a, as shown in FIG. 9, forming a protective liner layer 902. As the channel layer 702 is a silicon containing material, such as polysilicon layer, doped silicon layer or other suitable silicon materials, the oxygen elements supplied during the selective oxide process reacts with the silicon elements from the channel layer 702, forming the protective liner layer 902 at the sidewall 704a of the channel layer 702. In one example, the protective liner layer 902 is a silicon oxide layer.

In one example, the selective oxidation process may be a radical plasma oxidation process, an epitaxial deposition process, an atomic layer deposition process or a chemical oxidation process utilized to oxidize the sidewall 704a of the channel layer 702. The selective oxidation process forms the protective liner layer 902 on the sidewall 704a of the channel layer 702. In one example, the selective oxidation, such as the radical plasma oxidation, epitaxial deposition process or chemical oxidation process, may be performed in individual oxidation chambers. In certain embodiments the oxidation chambers may be coupled to, or part of, an integrated processing tool, such as the cluster system 400 depicted in FIG. 4. It is contemplated that the methods described herein may be practiced using other processing chamber and cluster tools having suitable process chambers coupled thereto.

In one example, the selective oxidation process described herein may be performed in any suitable chamber configured for radical oxidation, also known as in-situ steam generation (ISSG), or the like. Suitable oxidation chambers may include, but are not limited to, RADIANCE®, Plasma Immersion Ion Implantation (P3I), VANTAGE® RADOX™, VANTAGE® RADIANCE® Plus, CENTURA® RADOX™ chambers available from Applied Materials, Inc. of Santa Clara, Calif. Exemplary surface oxidation process, or called radical plasma oxidation process, may be performed with various oxidative chemistries include varying reducing gas concentration for reducing gases, such as one or more of hydrogen ($H_2$), ammonia ($NH_3$) or the like within an oxidative gas mixture include oxidative gases, such as one or more of oxygen ($O_2$), nitric oxide (NO), nitrous oxide ($N_2O$) or the like, and optionally including nonreactive gases, such as one or more of nitrogen gas ($N_2$), helium (He), argon (Ar), neon (Ne), and xenon (Xe). One form of radical plasma oxidation is performed using $H_2$ and $O_2$ only.

The selective oxidation process at operation 508 is a radical plasma oxidation process or "in-situ steam generation" (ISSG) process. The selective oxidation process may provide oxide growth on the channel layer 702 thermally controlled in an oxygenated environment. The in-situ steam generation (ISSG) process includes the formation of steam (H₂O) in the same chamber which the substrate to be oxidized is located (i.e., steam is formed in situ with the substrate).

The protective liner layer 902 as formed may be utilized as a protective layer during the subsequent etching process so as to protect the film layers, such as the channel layer 702 and the center filling layer 704, formed in the opening 606, thus improving and enhancing the interface protection during the etching process.

Figure 10:
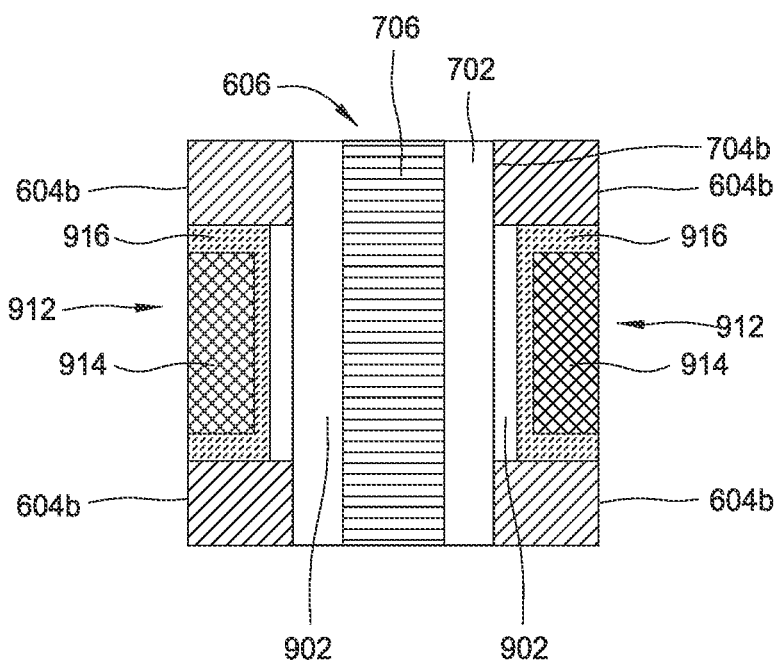

At operation 510, after the protective liner layer 902 is formed, a conductive structure 912 is then formed and filled in the space 802 in the film stack 604, as shown in FIG. 10. The conductive structure 912 is filled in the space 802 defined between the neighboring second layers 604b.

It is believed that the metal material in the conductive structure 912 utilized in the film stack 604 may efficiently improve the electrical performance, such as electrical conductivity, and mobility, and the like, in the film stack 604 when later utilized as a gate structure in NAND or VNAND three dimensional semiconductor memory devices. The deposition process may be a metal organic chemical vapor deposition (MOCVD) process, atomic layer deposition (ALD) process or a sputtering physical vapor deposition process, or other suitable process as needed. The deposition process may be performed in the processing chamber 232 depicted in FIG. 2. In the example depicted in FIG. 10, the conductive structure 912 includes a metal containing material 914 formed on a ferroelectric layer 916. The ferroelectric layer 916 is fabricated from a material different from the metal containing material 914. The ferroelectric layer 916 comprises a material that can switch the polarization to the nearby meal conductive materials, thus changing the conductivity of the metal conductive materials and inducing threshold voltage shift in the device transistor. Thus, by proper selection of the materials utilized to fabricate the ferroelectric layer 916, the device performance of the memory cell may be modulated and adjusted.

As the protective liner layer 902 is formed in the space 802, the ferroelectric layer 916 may not be in direct contact or interfaced with the channel layer 702 so as to enhance the electrical performance as needed. Furthermore, the ferroelectric layer 916 and the metal containing material 914 may be formed in one cluster system, such as the cluster system 400 depicted in FIG. 4, without breaking vacuum, thus improving process cycle time and manufacturing efficiency.

Furthermore, as the metal containing material 914 is formed on the ferroelectric layer 916, the ferroelectric layer 916 is covered and protected by the metal containing material 914 during the subsequent etching or deposition processes. By doing so, the ferroelectric layer 916 can be avoided from being chemical or plasma attacked during the subsequent etching or deposition processes, thus improving electrical performance of the device.

The ferroelectric layer 916 may be a high-k material having a dielectric constant greater than 4. Suitable examples of the high-k materials include hafnium containing material, such as hafnium dioxide ($HfO_2$), hafnium silicon oxide ($HfSiO_2$), hafnium aluminum oxide (HfAlO) or aluminum doped hafnium dioxide, hafnium zirconium oxide (HfZrO), doped hafnium dioxide, zirconium dioxide ($ZrO_2$), zirconium silicon oxide ($ZrSiO_2$), tantalum dioxide ($Ta_2O_5$), aluminum oxide ($Al_2O_3$), bismuth strontium titanium (BST), and platinum zirconium titanium (PZT), among others. In the example depicted in FIG. 10, the ferroelectric layer 916 may be a hafnium containing material, such as hafnium dioxide ($HfO_2$), hafnium silicon oxide ($HfSiO_2$), hafnium aluminum oxide (HfAlO), hafnium zirconium oxide (HfZrO) or suitable aluminum doped hafnium dioxide. In one example, the ferroelectric layer 916 is formed by a suitable deposition process, such as a CVD process, an ALD process, a sputter process or other suitable deposition process. In one specific example, the ferroelectric layer 916 is formed by an ALD process.

Suitable examples of the metal containing material 914 may be selected from a group consisting of TiN, TaN, TaSiN, TiSiN, tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, or combinations thereof. In one particular example, the metal containing material 914 may be TiN and the ferroelectric layer 916 may be hafnium dioxide ($HfO_2$), hafnium silicon oxide ($HfSiO_2$), hafnium aluminum oxide (HfAlO) hafnium zirconium oxide (HfZrO) or suitable aluminum doped hafnium dioxide.

Thus, methods and apparatus for forming stair-like structures for manufacturing three dimensional (3D) stacking of memory cells of semiconductor devices are provided. A protective liner layer at the interface along with a selective deposition and selective etching process is utilized to replace a dielectric layer in a film stack with a conductive structure. The protective liner layer may protect the interface in contact with the ferroelectric layer and the metal containing layer, thus providing a good control of the interface profile and topography. Furthermore, the ferroelectric layer formed and circumscribed by the metal containing layer as well as the protective layer can assist pertaining the structure and profile of the protective liner layer in the device structure. As a result, the conductive structure provides a good electrical contact at the interface, thus providing a desired electrical performance to the memory cells.

While the foregoing is directed to embodiments of the present disclosure, other and further embodiments of the disclosure may be devised without departing from the basic scope thereof, and the scope thereof is determined by the claims that follow.

The invention claimed is:

1. A method of memory device on a substrate comprises:
    forming an opening in a film stack including a first layer and a second layer;
    filling the opening with one or more layers, wherein the one or more layers comprise a channel layer, the channel layer having a sidewall adjacent the first layer and the second layer;
    selectively removing the first layer from the film stack to create a space and expose a portion of the sidewall of the channel layer;
    selectively oxidizing the portion of the sidewall of the channel layer to form a protective liner layer; and
    filling the space with a conductive structure.

2. The method of claim 1, wherein the first layer is a silicon nitride layer and the second layer is a silicon oxide layer.

3. The method of claim 1, wherein selective oxidizing the portion of the channel layer further comprises:
    performing a radical plasma oxidation to oxidize the channel layer.

4. The method of claim 1, wherein the channel layer is a silicon containing material.

5. The method of claim 1, wherein the conductive structure comprises a metal containing material and a ferroelectric layer.

6. The method of claim 5, wherein the ferroelectric layer is fabricated from high dielectric constant material.

7. The method of claim 5, wherein high dielectric constant material is selected from a group consisting of at least one of hafnium containing materials, zirconium dioxide ($ZrO_2$), zirconium silicon oxide ($ZrSiO_2$), tantalum dioxide ($Ta_2O_5$), aluminum oxide ($Al_2O_3$), bismuth strontium titanium (BST), and platinum zirconium titanium (PZT).

8. The method of claim 5, wherein the protective liner layer is in direct contact with the ferroelectric layer.

9. The method of claim 8, wherein the protective liner layer is a silicon oxide layer.

10. A method of forming stair-like structures on a substrate comprises:
   selectively oxidizing an outer side portion of a channel layer exposed by a space defined between dielectric layers formed in a film stack, wherein the film stack has a center opening filled by a multi-layer structure comprising the channel layer;
   forming a protective liner layer on the outer side portion of the channel layer; and
   forming a ferroelectric layer in contact with the protective liner layer, wherein the ferroelectric layer is a high dielectric constant material.

* * * * *